(12) United States Patent
Zhu et al.

(10) Patent No.: US 11,430,496 B2
(45) Date of Patent: Aug. 30, 2022

(54) PHASE-AWARE DDR COMMAND DYNAMIC SCHEDULING

(71) Applicant: Synopsys, Inc., Mountain View, CA (US)

(72) Inventors: Jun Zhu, San Jose, CA (US); Yunyun Xiao, Beijing (CN)

(73) Assignee: SYNOPSYS, INC., Mountain View, CA (US)

(*) Notice: Subject to any disclaimer, the term of this patent is extended or adjusted under 35 U.S.C. 154(b) by 0 days.

(21) Appl. No.: 17/246,385

(22) Filed: Apr. 30, 2021

(65) Prior Publication Data

US 2021/0375341 A1 Dec. 2, 2021

(30) Foreign Application Priority Data

Apr. 30, 2020 (WO) ................ PCT/CN2020/088319

(51) Int. Cl.
*G11C 7/22* (2006.01)
*G11C 7/10* (2006.01)

(52) U.S. Cl.
CPC ............ *G11C 7/222* (2013.01); *G11C 7/1045* (2013.01); *G11C 7/1048* (2013.01); *G11C 7/1066* (2013.01); *G11C 7/1093* (2013.01)

(58) Field of Classification Search
CPC ..................................................... G11C 7/222
USPC .......................................................... 365/233.1
See application file for complete search history.

(56) References Cited

U.S. PATENT DOCUMENTS

2009/0238016 A1* 9/2009 Matulik .............. G06F 13/1689
365/194
2019/0171598 A1* 6/2019 Zhu ..................... G06F 13/3625

* cited by examiner

*Primary Examiner* — Muna A Techane
(74) *Attorney, Agent, or Firm* — Sterne, Kessler, Goldstein & Fox P.L.L.C.

(57) ABSTRACT

A method for performing phase aware dynamic scheduling of a plurality of double data rate (DDR) commands includes determining a ratio of a frequency of DDR controller clock to a frequency of a DDR clock. The method includes determining a number of clock cycles of the DDR clock required for each DDR command of the plurality of DDR commands. The method includes, based on the ratio of the frequency of the DDR controller clock to the frequency of the DDR clock and the number of clock cycles of the DDR clock required for each DDR command, determining a sequence of the plurality of DDR commands according to a priority corresponding to the each DDR command, and transmitting the plurality of DDR commands to DDR devices over one or more clock cycles of the DDR controller clock according to the determined sequence of the plurality of DDR commands.

20 Claims, 14 Drawing Sheets

PHASE-AWARE DDR COMMAND DYNAMIC SCHEDULING

RELATED APPLICATION

The present application claims priority under 35 U.S.C. § 119(a) to PCT Application No. PCT/CN2020/088319 filed on Apr. 30, 2020, which is incorporated herein by reference in its entirety for all purposes.

FIELD(S) OF TECHNOLOGY

This disclosure relates to the field of electronic design in general, including the following topics: phase-aware double data rate (DDR) command dynamic scheduling.

BACKGROUND

In the DDR controller, control commands are sent according to the controller clock that is slower than the DDR clock. Usually, the DDR controller frequency is ½ or ¼ of the DDR clock frequency that is referenced as a 1:2 or 1:4 mode, respectively. In the 1:4 mode, one controller clock cycle is equivalent to four DDR clock cycles. Accordingly, in one controller clock cycle time, up to 4 one-cycle DDR commands can be sent to DDR devices, or one two-cycle DDR commands (a command that takes two consecutive DDR clock cycles) and two one-cycle DDR commands can be sent to DDR devices. DDR commands require different clock cycles.

For example, in DDR5 technology, the READ command is a two-cycle command, which crosses the controller clock cycle boundary. The DDR command that crosses the controller clock boundary needs to be delayed because of the next controller clock cycle required. Also, for the 1:2 mode, the DDR commands are split into two groups: phase-0 commands and phase-1 commands. If DDR commands for the phase-0 or phase-1 are not ready to send to the DDR device, DDR commands from the other phase cannot utilize the available clock cycle.

SUMMARY

In one embodiment, a method for phase aware dynamic scheduling is disclosed. The method includes determining a ratio of a frequency of DDR controller clock to a frequency of a DDR clock. The method includes determining a number of clock cycles of the DDR clock required for each DDR command of the plurality of DDR commands. The method includes based on the ratio of the frequency of the DDR controller clock to the frequency of the DDR clock and the number of clock cycles of the DDR clock required for each DDR command, determining a sequence of the plurality of DDR commands according to a priority corresponding to the each DDR command. The method includes transmitting one or more DDR commands of the plurality of DDR commands to one or more DDR devices over one or more clock cycles of the DDR controller clock according to the determined sequence of the plurality of DDR commands.

In another embodiment, a system for phase aware dynamic scheduling is disclosed. The system includes a memory configured to store operations and one or more processors configured to perform the operations, including determining a ratio of a frequency of DDR controller clock to a frequency of a DDR clock. The operations include determining a number of clock cycles of the DDR clock required for each DDR command of the plurality of DDR commands. The operations include based on the ratio of the frequency of the DDR controller clock to the frequency of the DDR clock and the number of clock cycles of the DDR clock required for each DDR command, determining a sequence of the plurality of DDR commands according to a priority corresponding to the each DDR command. The operations include transmitting one or more DDR commands of the plurality of DDR commands to one or more DDR devices over one or more clock cycles of the DDR controller clock according to the determined sequence of the plurality of DDR commands.

In yet another embodiment, a non-transitory, tangible computer-readable device having instructions stored thereon is disclosed. The instructions when executed by at least one computing device, cause the at least one computing device to perform operations for phase aware dynamic scheduling. The operations include determining a ratio of a frequency of DDR controller clock to a frequency of a DDR clock. The operations include determining a number of clock cycles of the DDR clock required for each DDR command of the plurality of DDR commands. The operations include based on the ratio of the frequency of the DDR controller clock to the frequency of the DDR clock and the number of clock cycles of the DDR clock required for each DDR command, determining a sequence of the plurality of DDR commands according to a priority corresponding to the each DDR command. The operations include transmitting one or more DDR commands of the plurality of DDR commands to one or more DDR devices over one or more clock cycles of the DDR controller clock according to the determined sequence of the plurality of DDR commands.

DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such figures are not necessarily drawn to scale and are part of the Disclosure.

In the figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

Figure 1:
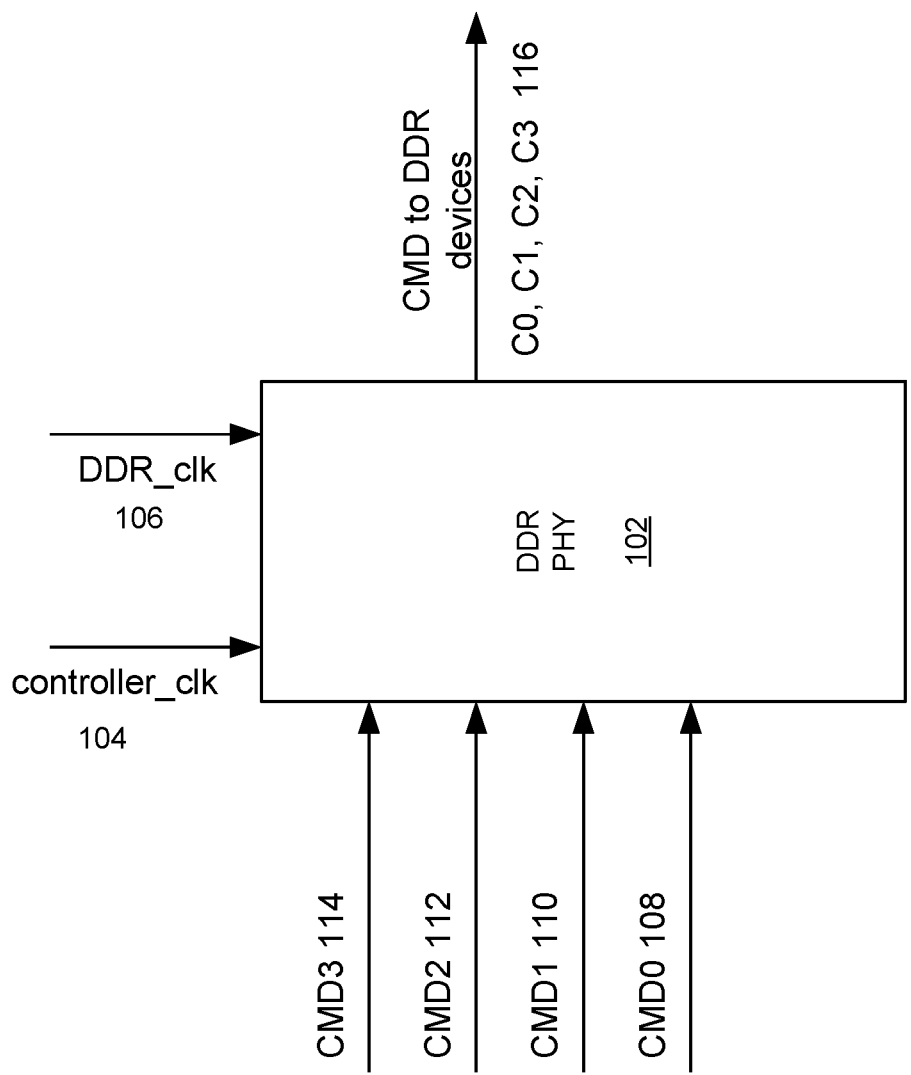
FIG. 1 illustrates a DDR controller in accordance with some embodiments.

In such various figures, reference signs may be omitted as is consistent with accepted engineering practice. However, one of ordinary skill in the art will understand that the illustrated components are readily understood when viewed in the context of the illustration as a whole and the accompanying disclosure describing such various figures.

DETAILED DESCRIPTION

The Figures and the following Detailed Description signify innovations, embodiments, and/or examples by way of illustration only, with various features, structures, or characteristics described together in a single embodiment to streamline the disclosure. Variations of any of the elements, processes, machines, systems, manufactures, or compositions disclosed by such exemplary innovations, embodiments, and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments, and/or examples. In the interest of not obscuring the presentation of the exemplary innovations, embodiments, and/or examples in the following Detailed Description, some processing steps or operations that are known in the art may be combined for presentation and illustration purposes and might not be described in detail. However, a person skilled in the art will recognize that these exemplary innovations, embodiments, and/or examples may be used in commerce without these specific details or with equivalents thereof. In other instances, well-known processes and devices are not described in detail as not to unnecessarily obscure aspects of these exemplary innovations, embodiments, and/or examples. In other instances, some processing steps or operations that are known in the art may not be described at all. Instead, the following description is focused on the distinctive features or elements of various exemplary innovations, embodiments, and/or examples. Furthermore, while this description may refer to some components of the structure in the singular tense, more than one component may be depicted throughout the figures, and like components are labeled with like numerals.

The present disclosure is related to phase aware dynamic scheduling method that allows a double data rate (DDR) controller to allocate DDR commands dynamically and schedule the DDR commands crossing a controller clock boundary. As a result, DDR command scheduling performance may be improved, particularly for new DDR technologies like DDR4, DDR5, DDR6, low-power DDR4 (LPDDR4), LPDDR5, and LPDDR6. The present disclosure is directed to an improvement to maximize the utilization of the DDR command bus. Phase aware dynamic scheduling may provide better performance than static multiplexers used for DDR command scheduling in prior art. Because DDR commands can be sent out relatively earlier, read-write (RW) access latency may be improved. Further, DDR bus utilization may be maximized because an empty cycle is avoided. The phase aware dynamic scheduling according to various embodiments described herein therefore may allow the DDR controller to schedule DDR commands dynamically in any phase. Dynamic scheduling of the DDR commands may improve the DDR controller's performance significantly. By way of a non-limiting example, DDR bus utilization may be improved up to 29%.

FIG. 1 illustrates a DDR controller in accordance with some embodiments. As described above, in a DDR controller, control commands are controller clock based, which is slower in comparison with the DDR clock. The DDR controller having its frequency half of the DDR clock frequency may be referenced as operating in the 1:2 mode. Similarly, the DDR controller having its frequency as ¼ of the DDR clock frequency may be referenced as operating in the 1:4 mode. DDR controller operating in the 1:4 mode can send in one controller clock cycle, for example, up to four one-cycle DDR commands to one or more DDR devices, or one two-cycle DDR command and two one-cycle DDR commands, etc.

To maximize the utilization of the DDR command bus, the controller needs to send, in one controller cycle, up to four DDR commands to a DDR physical layer (PHY). The DDR PHY may then serialize the received commands to send them to the DDR. For example, assuming that CMD0, CMD1, CMD2, and CMD3 are one-cycle DDR commands. The DDR controller may send CMD0, CMD1, CMD2, and CMD3 in a single DDR controller clock cycle. By way of a non-limiting example, in the 1:4 mode, DDR PHY can then send CMD0 in the first DDR clock cycle, CMD1 in the second DDR clock cycle, CMD2, and CMD3 in the third and fourth DDR clock cycles, respectively. Accordingly, CMD0 may be referenced as a phase-0 command, CMD1 as a phase-1 command, and so on. There are many DDR command types, e.g., ACT, READ, WRITE, PRE, REF, etc. For DDR4 technology, all of the specified DDR commands are one-cycle command. However, for DDR5 technology, ACT, READ, and WRITE are two-cycle commands, and PRE and REF are one-cycle commands that may be similarly serialized in the 1:2 and/or 1:4 mode.

The DDR PHY 102, shown in FIG. 1, receives a DDR controller clock controller_clk 104 and a DDR clock DDR_clk 106. As described above, the DDR controller clock 104 may be in the 1:2 or 1:4 mode. The DDR PHY 102 may send CMD0 108, CMD1 110, CMD2 112, and CMD3 114 in a single clock cycle of the DDR controller clock controller_clk 104. DDR PHY 102 may serialize the CMD0 108, CMD1 110, CMD2 112, and CMD3 114 as C0, C1, C2, and C3 116 to send to one or more DDR devices.

Figure 2:
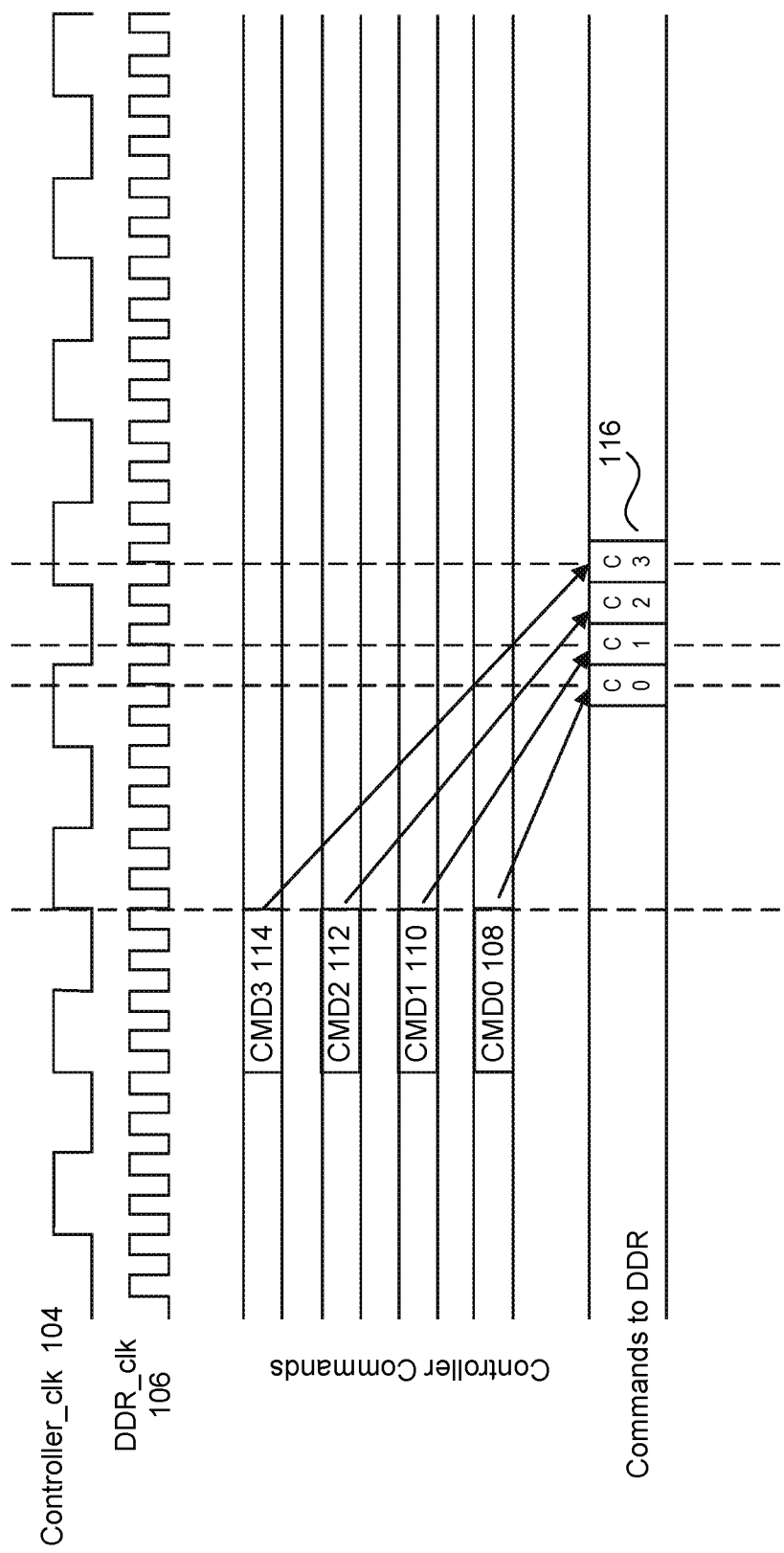
FIG. 2 illustrates timing diagrams of the DDR controller of FIG. 1, in accordance with some embodiments.

FIG. 2 illustrates timing diagrams of the DDR PHY 102 of FIG. 1, in accordance with some embodiments. As shown in FIG. 2, a clock frequency of the DDR controller clock controller_clk 104 is ¼ of a clock frequency of the DDR clock DDR_clk 106. DDR PHY 102 processing four DDR commands CMD0 through CMD3 in a single clock cycle of the DDR controller clock controller_clk 104, and the DDR PHY 102 serializes CMD0 108 through CMD3 114 as C0, C1, C2, and C3 116 to send to the one or more DDR devices.

Figure 3A:
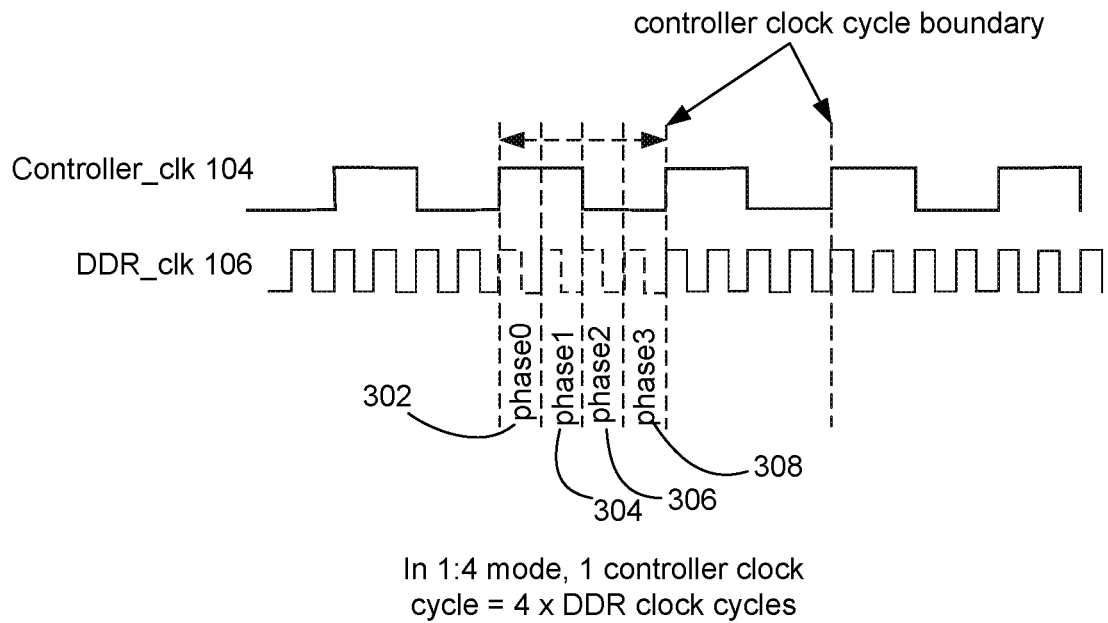
FIG. 3A and FIG. 3B illustrate the controller clock cycle boundary and related phases in the 1:4 and 1:2 mode, respectively.
Figure 3B:
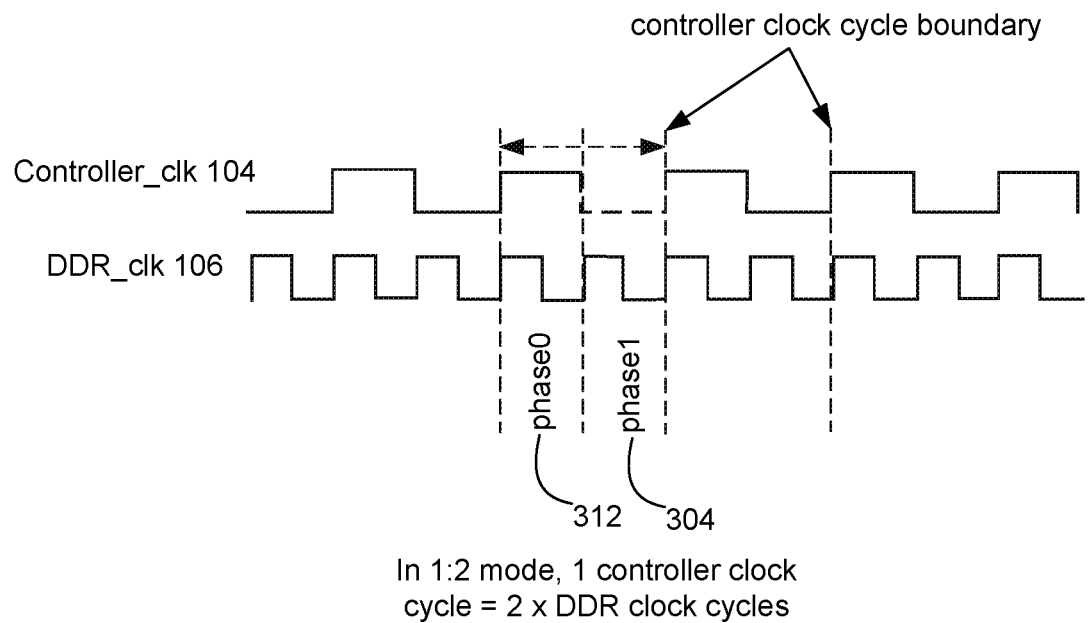

FIG. 3A and FIG. 3B illustrate the controller clock cycle boundary and related phases in the 1:4 and 1:2 mode, respectively. As shown in FIG. 3A, in the 1:4 mode, time duration of one clock cycle of the DDR controller clock 104 is equal to time duration of four clock cycles of the DDR clock 106. Each clock cycle of the DDR clock corresponding to the clock cycle of the DDR controller clock may be referenced as phase-0 302, phase-1 304, phase-2 306, and phase-3 308. Accordingly, the DDR command CMD0 108 being sent during the phase-0 302 may also be referred to as a phase-0 DDR command. Similarly, CMD1 110, CMD2 112, and CMD3 114 may be referred to as phase-1 304, phase-2 306, and phase-3 308 DDR commands, respectively.

As shown in FIG. 3B, in the 1:2 mode, time duration of one clock cycle of the DDR controller clock 104 is equal to time duration of two clock cycles of the DDR clock 106. Each clock cycle of the DDR clock 106 corresponding to the clock cycle of the DDR controller clock may be referenced as phase-0 302 and phase-1 304. Accordingly, the DDR commands CMD0 108 being sent during the phase-0 302 and CMD1 110 being sent during phase-1 304 may be referred to as the phase-0 302 command and the phase-1 304 command, respectively.

Figure 4:
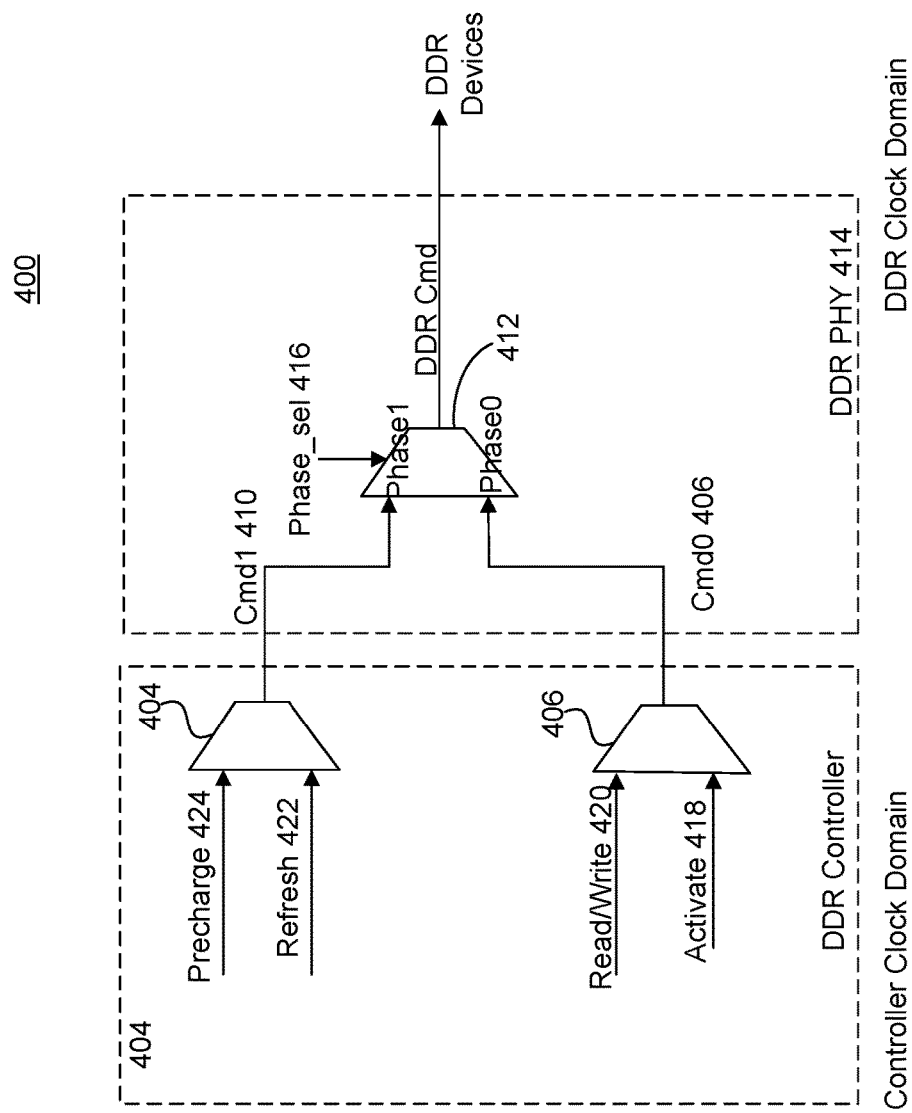
FIG. 4 illustrates a prior art multiplexer for the DDR4 command scheduling in the 1:2 mode.

FIG. 4 illustrates a prior art multiplexer for the DDR4 command scheduling in the 1:2 mode. As described above, in DDR4 technology, all DDR commands are one-clock cycle commands. In the 1:2 mode, a multiplexer 400 shown in FIG. 4 may be used, in which a DDR controller section 402 may have two multiplexers 404 and 406 with their outputs 408 and 410 as inputs CMD0 and CMD1, respectively, to another multiplexer 412 in the DDR PHY 414 section. Accordingly, based on the phase selector signal phase_sel 416, either CMD0 408 or CMD1 410 may be sent to one or more DDR devices. The multiplexers 404 and 406 in the DDR controller section 402 may operate according to the DDR controller clock 104's frequency. Therefore, these multiplexers are in the controller clock domain. Similarly, the multiplexer in the DDR PHY section may operate according to the DDR clock 106's frequency, and hence this multiplexer is in the DDR clock domain.

Further, as shown in FIG. 4, static multiplexers are used to select the DDR commands to send to the one or more DDR devices. For example, phase-0 command CMD0 408 comes from the multiplexer 406 that receives Activate (ACT) 418, and READ/WRITE 420 as its inputs, while phase-1 command CMD1 410 comes from the multiplexer 404 that receives Precharge (PRE) 424 and Refresh (REF) 422 as its inputs. In other words, ACT 418 and READ/WRITE 420 can be phase-0 command only, and PRE 424 and REF 422 can be phase-1 command only. If ACT 418 and/or READ/WRITE 420 command is not ready in a clock cycle corresponding to phase-0 of the DDR clock, the phase-0 command will be empty in the output of the multiplexer 412, and it could not be used for another command, for example, phase-1 command, such as PRE 424 or REF 422. Accordingly, the DDR bus remains underutilized.

The READ command, which is a single clock cycle command in DDR4 technology, is a two-cycle long command in DDR5 technology. Accordingly, the READ command, and any other two-cycle long DDR command, cannot be sent as a phase-1 command because it will occupy the clock cycle corresponding to CMD1 and the next cycle corresponding to CMD0 in the 1:2 mode. This scenario is known as command crossing controller clock cycle boundary. The DDR command that crosses the DDR controller block boundary is delayed to the next DDR controller clock cycle in the prior art. In other words, static scheduling and no command crossing controller clock cycle boundary adversely impact the DDR system performance.

Figure 5A:
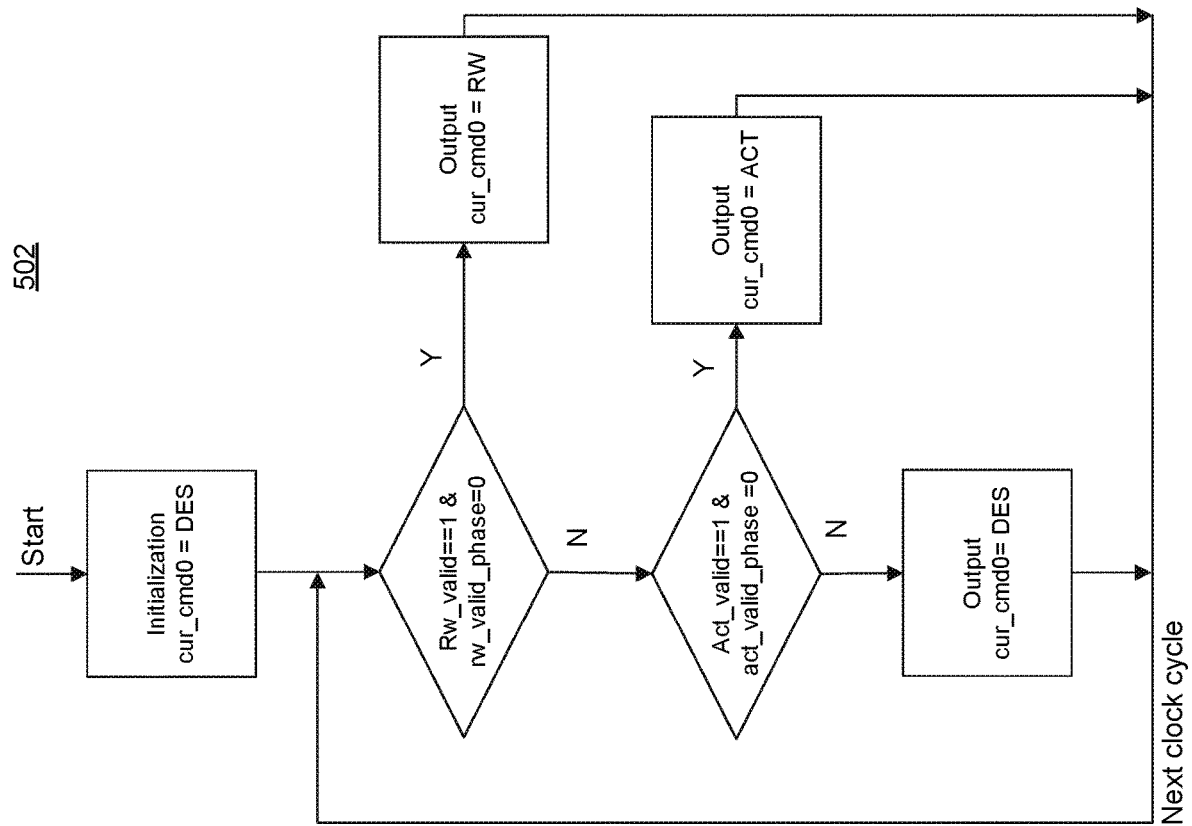
FIG. 5A and FIG. 5B illustrate flow-charts for phase-0 and phase-1 command, respectively, according to the pseudo-code functions of the prior art.
Figure 5B:
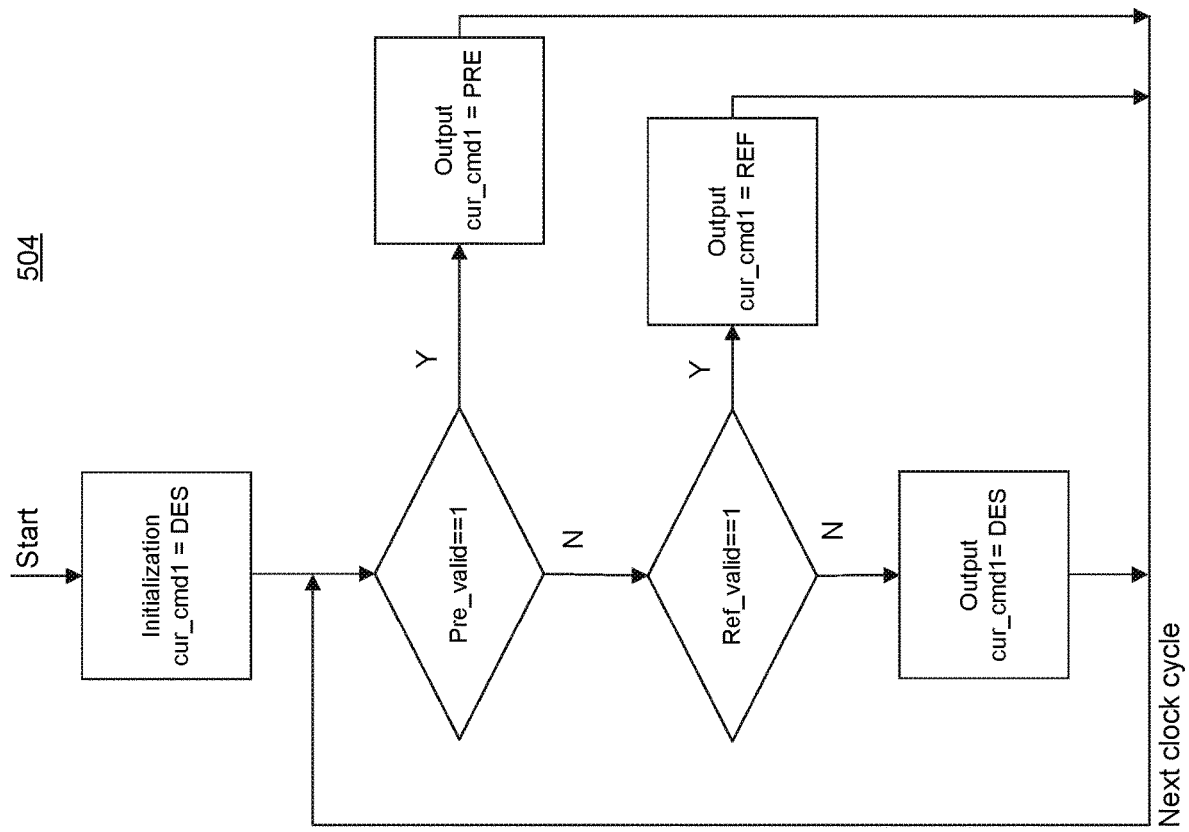

FIG. 5A and FIG. 5B illustrate a flow-chart for phase-0 and phase-1 command, respectively. Pseudo-code corresponding to a flow chart 502 and a flow chart 504 of FIG. 5A and FIG. 5B, respectively, of the prior art may be described as below. In DDR4 technology, all DDR commands are single-cycle commands.

```
for every controller clock cycle {
    // initialize command
    cur_cmd0 = DES, cur_cmd1 = DES
    if (rw_valid == 1 and rw_valid_phase == 0) {
    cur_cmd0 = RW
        } else if (act_valid == 1 and act_valid_phase == 0) {
            cur_cmd0 = ACT
        }
        if (pre_valid == 1) {
            cur_cmd1 = PRE // for both cases pre_valid_phase == 0 and
pre_valid_phase == 1
        } else if (ref_valid == 1) {
            cur_cmd1 = REF // for both cases ref_valid_phase == 0 and
ref_valid_phase == 1
        }
}
```

The above pseudo-code describes the function of the prior art DDR PHY shown in FIG. 4. Further, commands' order for phase-0 is RW followed by ACT, and for phase-1 is PRE followed by REF.

Figure 6:
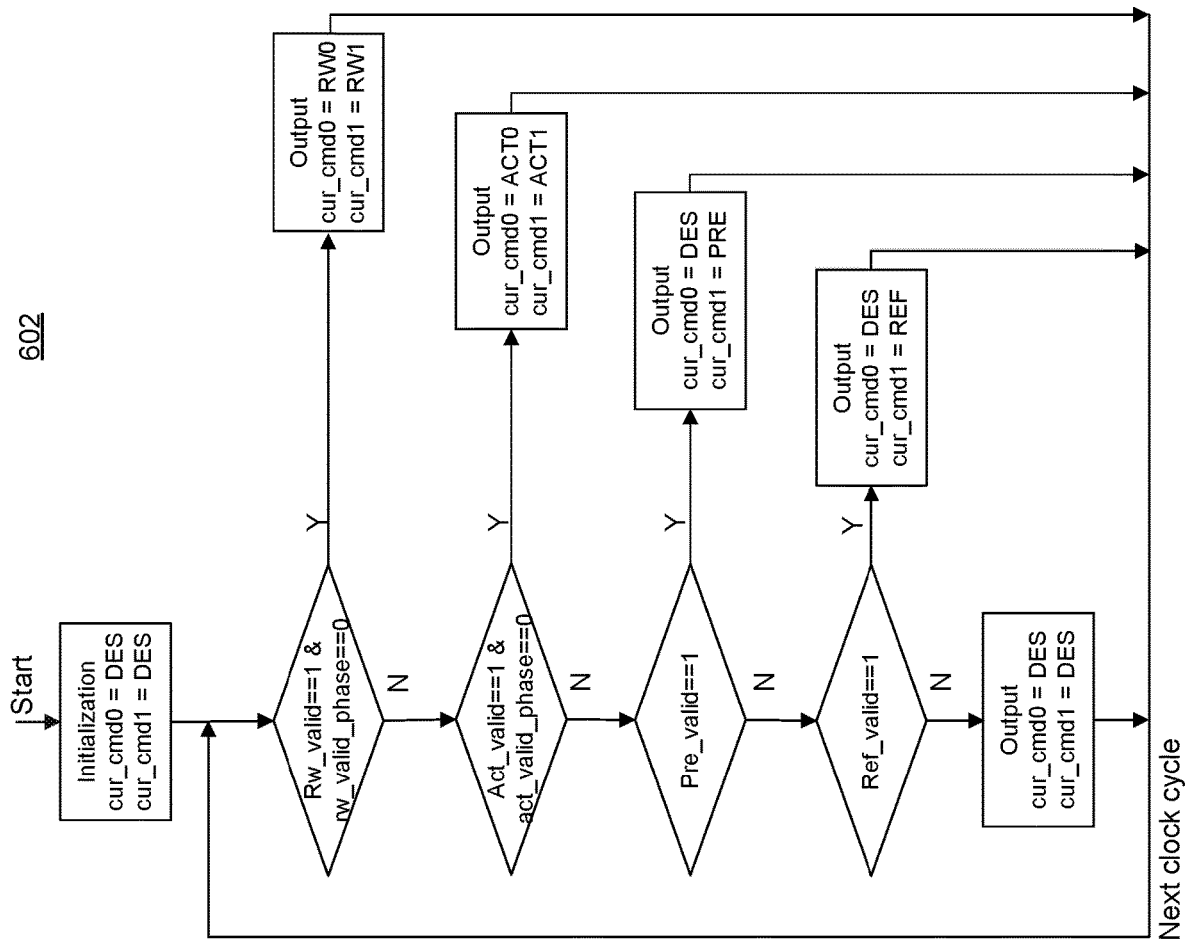
FIG. 6 illustrates a flow-chart for a two-cycle command according to a pseudo-code function of the prior art.

FIG. 6 illustrates a flow-chart for two-cycle commands according to a pseudo-code function of the prior art. In DDR5 technology, as described above, RW and ACT are two-cycle commands, and PRE and REF are one-cycle commands. A pseudo-code corresponding to a flow-chart 602 may be represented as:

```
for every controller clock cycle {
    // initialize command
    cur_cmd0 = DES, cur_cmd1 = DES
    if (rw_valid == 1 and rw_valid_phase == 0) {
    cur_cmd0 = RW0, cur_cmd1 = RW1
        } else if (act_valid == 1 and act_valid_phase == 0) {
            cur_cmd0 = ACT0, cur_cmd1 = ACT1
        } else if (pre_valid == 1) {
            cur_cmd1 = PRE // for both cases pre_valid_phase == 0 and
pre_valid_phase == 1
        } else if (ref_valid == 1) {
            cur_cmd1 = REF // for both cases ref_valid_phase == 0 and
ref_valid_phase == 1
        }
}
```

The above pseudo-code describes the function of the prior art of DDR PHY shown in FIG. 4. Further, the command order may be RW, ACT, PRE, and REF.

The phase aware dynamic scheduling method, as described in various embodiments in this disclosure, may improve scheduling performance by allocating the phase commands dynamically and scheduling the phase commands crossing the DDR controller clock boundary. By way of a non-limiting example, the following pseudo-code may be used that describes an algorithm of the phase aware dynamic scheduling method.

In some embodiments, in the 1:2 mode, there may be four pairs of phase signal inputs in the controller clock domain: (1) rw_valid and rw_valid_phase (Read/Write (RW) command and phase); (2) act_valid and act_valid_phase (ACT command and phase); (3) pre_valid and pre_valid_phase (PRE command and phase); and (4) ref_valid and ref_valid_phase (REF command and phase). When the clock signal is active high, i.e., at level 1, *_valid command is ready in the phase *_valid_phase of the clock cycle, and when the clock signal is active low, *_valid command is not ready in the clock cycle and the *_valid_phase signal is ignored. In this case, * refers to any of the ACT, PRE, REF, and RW commands. The phase signal *_valid_phase is a one-bit signal for the 1:2 mode, and the same *_valid_phase is a two-bit signal in the 1:4 mode. In the 1:2 mode, when *_valid signal is active high, i.e., at level 1, then the command is read in phase-0 of the current clock cycle if *_valid_phase is 1'b0, i.e., one bit signal with value 0, and the command is read in phase-1 of the current clock cycle if *_valid phase is 1'b1, i.e., one bit signal with value 1. Further, RW and ACT are two-cycle commands, and PRE and REF are one-cycle commands. Accordingly, RW command consists of RW0 and RW1, and ACT command consists of ACT0 and ACT1. Deselect (DES) command may be used to specify no operation.

Figure 7:
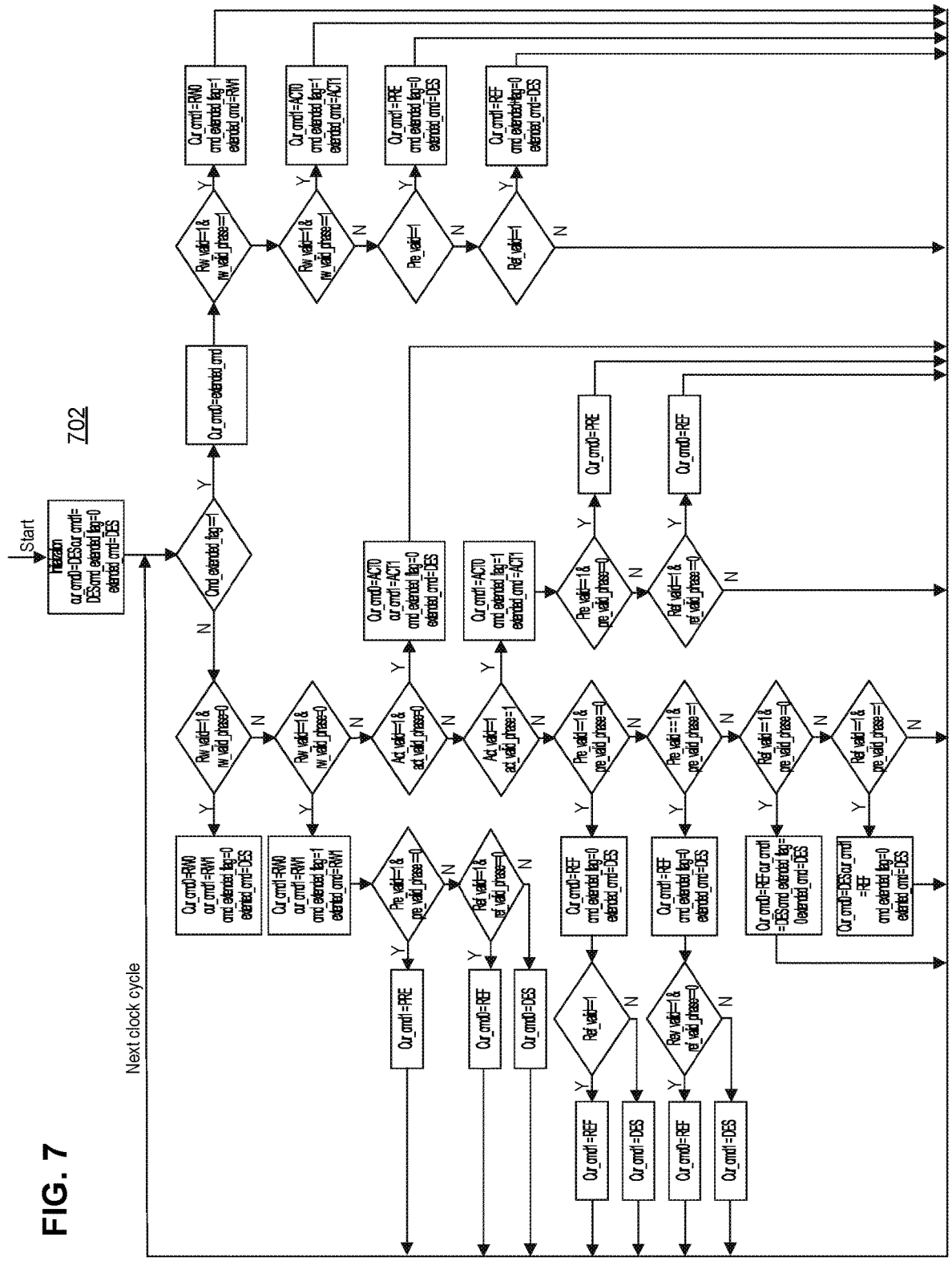
FIG. 7 illustrates a flow-chart for phase aware dynamic scheduling, in accordance with some embodiments.

FIG. 7 illustrates a flow-chart for phase aware dynamic scheduling, in accordance with some embodiments. The pseudo-code, as described below, corresponds to a flow chart 702 for phase aware dynamic scheduling as shown in FIG. 7.

```
for every controller clock cycle {
// initialize command
cur_cmd0 = DES, cur_cmd1 = DES
if (cmd_extended_flag == 1) {
    // phase0 is occupied by two-cycle command starting in previous cycle
    cur_cmd0 = extended_cmd
    // only phase1 is available
    if (rw_valid == 1 and rw_valid_phase == 1) {
        // RW command occupies phase1 (CMD1) of current cycle,
        // RW command extends to next cycle
        cur_cmd1 = RW0, extended_cmd = RW1, cmd_extended_flag = 1
    } else if (act_valid == 1 and act_valid_phase == 1) {
        // ACT command occupies phase1 (CMD1) of current cycle
        // ACT command extends to next cycle
        cur_cmd1 = ACT0, extended_cmd = ACT1, cmd_extended_flag = 1
    } else if (pre_valid == 1) {
        // no command is extended to next cycle
        cur_cmd1 = PRE, cmd_extended_flag = 0
    } else if (ref_valid == 1) {
        // no command is extended to next cycle
        cur_cmd1 = REF, cmd_extended_flag = 0
    }
} else {
    if (rw_valid == 1) {   // RW command is ready in this cycle
        if (rw_valid_phase == 0) { // RW command is ready in phase0
            // RW command occupies two phases of current clock cycle
            cur_cmd0 = RW0, cur_cmd1 = RW1, cmd_extended_flag = 0
            go to next clock cycle
        } else {   // rw_valid_phase == 1
            // RW command occupies phase1 (CMD1) of current cycle,
            // and it also extends to next cycle phase0 (CMD0)
            cur_cmd1 = RW0, extended_cmd = RW1, cmd_extended_flag = 1
            // check if one-cycle command REF and PRE can be placed in phase0
            if (pre_valid == 1 and pre_valid_phase == 0) {
                cur_cmd0 = PRE
            } else if (ref_valid == 1 and ref_valid_phase == 0) {
                Cur_cmd0 = REF
            }
        }
    } else if (act_valid == 1) { // no RW, ACT is ready
        if (act_valid_phase == 0) { // ACT command is ready in phase0
            // ACT command occupies two phases of current clock cycle
            cur_cmd0 = ACT0, cur_cmd1 = ACT1, cmd_extended_flag = 0
            go to next clock cycle
        } else {   // act_valid_phase == 1
            // ACT command occupies phase1 (CMD1) of current cycle,
            // and it also extends to next cycle phase0 (CMD0)
            cur_cmd1 = ACT0, extended_cmd = ACT1, cmd_extended_flag = 1
            // check if one-cycle command REF and PRE can be placed in phase0
            if (pre_valid == 1 and pre_valid_phase == 0) {
                cur_cmd0 = PRE, cmd_extended_flag = 0
            } else if (ref_valid == 1 and ref_valid_phase == 0) {
                cur_cmd0 = REF, cmd_extended_flag = 0
            }
        }
    } else if (pre_valid == 1) {   // no RW, no ACT, PRE is ready
        // no command extends to next cycle
        cmd_extended_flag = 0
        if (pre_valid_phase == 0) {
```

```
            // PRE occupies CMD0, check if REF could be placed in CMD1
            cur_cmd0 = PRE
            if (ref_valid==1) {
               // for both cases ref_valid_phase==0 and ref_valid_phase==1
               cur_cmd1 = REF
            }
         } else { //  pre_valid_phase == 1
            // no command extends to next cycle
            cmd_extended_flag = 0
            // PRE occupies CMD1, check if REF could be placed in CMD0
            cur_cmd1 = PRE
            if (ref_valid == 1 and ref_valid_phase == 0) {
               cur_cmd0 = REF
            }
         }
      }
   } else if (ref_valid == 1) {   // no RW, no ACT, no PRE
      // no command extends to next cycle
      cmd_extended_flag = 0
      if (ref_valid_phase == 0) {
         cur_cmd0 = REF
      } else {
         cur_cmd1 = REF
      }
   }
}
```

Figure 8:
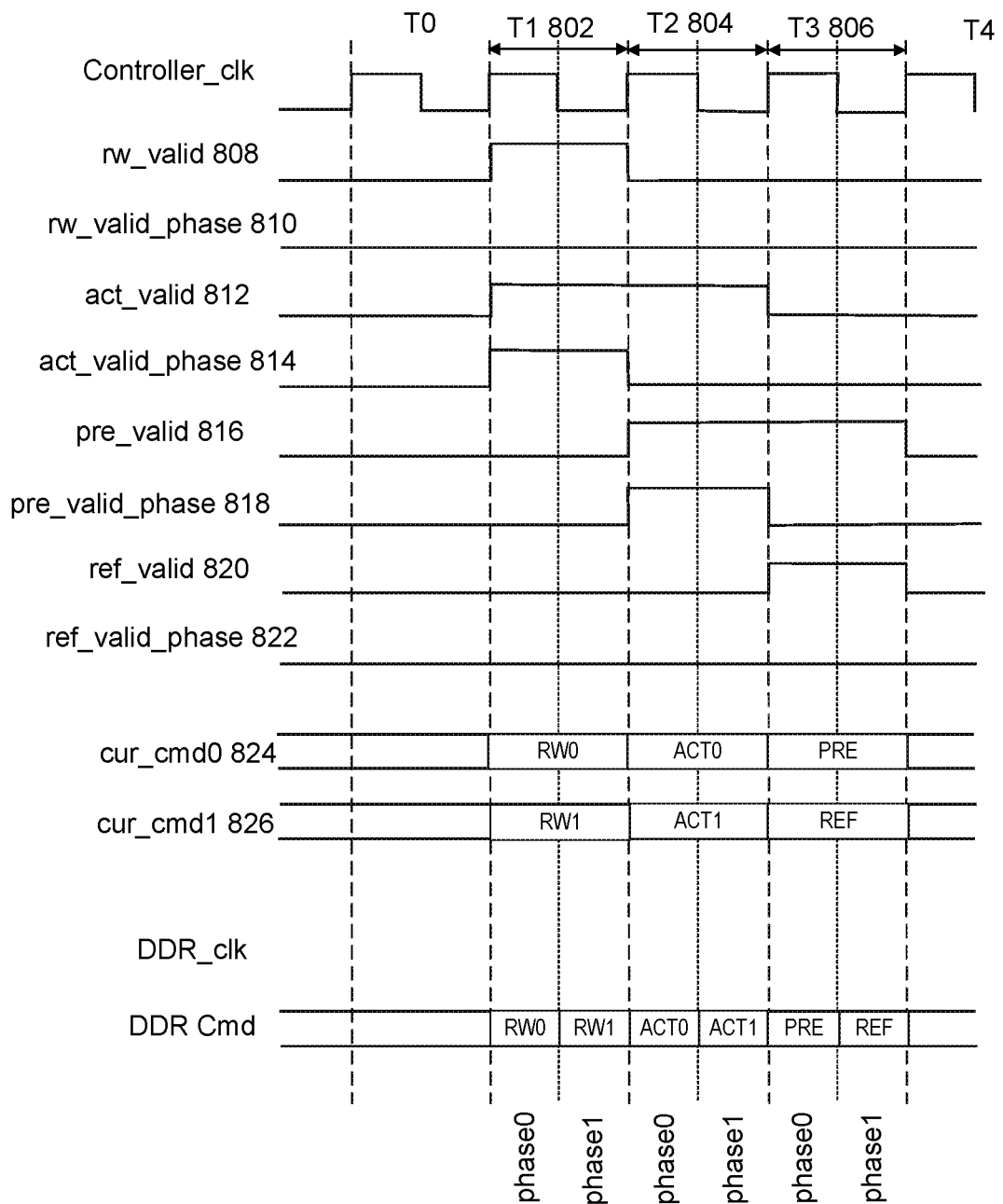
FIG. 8 illustrates a timing diagram of an example of phase aware dynamic scheduling, in accordance with some embodiments.

FIG. 8 illustrates a timing diagram of an example of phase aware dynamic scheduling, in accordance with some embodiments. As shown in FIG. 8, during T1 period 802, rw_valid 808 and act_valid 812 are at level 1, but rw_valid_phase 810 and act_valid_phase 814 are at level 0 and 1, respectively. Because the RW command has a priority over the ACT command, the RW command is sent out during the T1 period 802. In this case, cur_cmd0 824 is RW0 and cur_cmd1 826 is RW1 during the T1 period 802 and rw_valid changes to 0 in the next clock cycle, i.e., T2 period 804. ACT command may be delayed to the T2 period 804 because the T1 period 802 is occupied by the RW command. During the T2 period 804, act_valid is still at level 1 while the act_valid_phase changes to 0. Accordingly, ACT command is sent out during the T2 period 804 with cur_cmd0 as ACT0 and cur_cmd1 as ACT1. While pre_valid 816 is at level 1 during the T2 period 804, pre_valid 816 is delayed up to the T2 period 804 because ACT occupied the T2 period 804. During T3 period 806, pre_valid 816 is still at level 1, and pre_valid_phase 818 changes to level 0. In the meantime, ref_valid signal 820 is at level 1, and ref_valid_phase 822 is at level 0. However, because PRE has a priority over REF, PRE command is sent during phase-0 of the T3 period 806 as cur_cmd0, and REF is delayed to phase-1 of the T3 period 806 as cur_cmd1.

Figure 9:
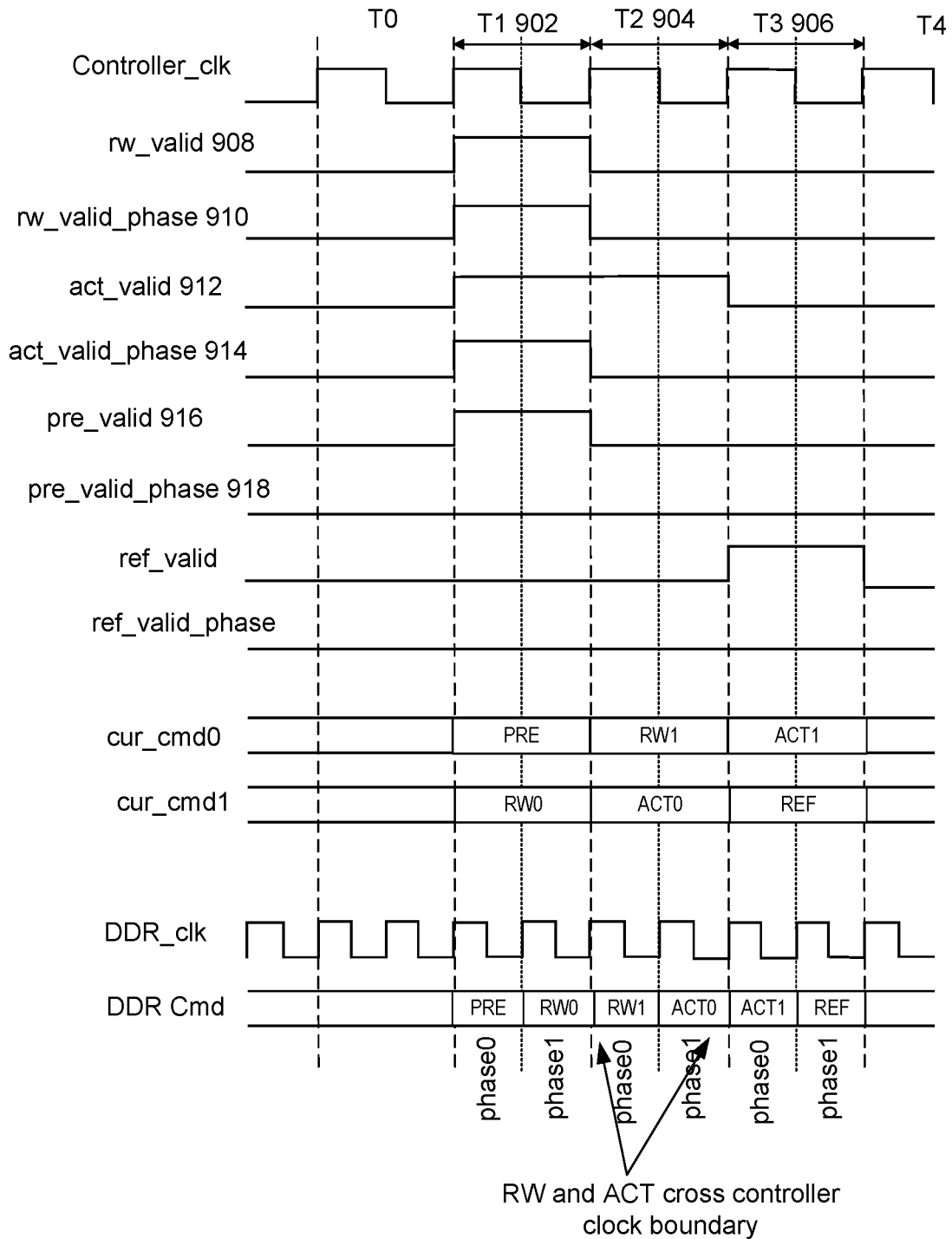
FIG. 9 illustrates a timing diagram of another example of phase aware dynamic scheduling, in accordance with some embodiments.

FIG. 9 illustrates a timing diagram of another example of phase aware dynamic scheduling, in accordance with some embodiments. The example shown in FIG. 9 illustrates multi-cycle commands that cross controller clock cycle boundary. As shown in FIG. 9, during T1 period 902, three commands RW rw_valid 908, ACT 912, and PRE 916 are ready with rw_valid_phase 910, act_valid_phase 914 as 1'b1 and pre_valid_phase 918 as 1'b0. Because RW has the highest priority, RW0 may take phase 1 of the T1 period 902 and RW1 may take phase0 of the T2 period 904. Thus, the RW command crosses the controller clock cycle, in this example, the T1 period 902 and the T2 period 904 boundary. In this case, the ACT command may be delayed to the next cycle, i.e., the T2 period 904. However, PRE command may be sent out in phase-0 of the T1 period 902. Accordingly, during the T1 period 902, cur_cmd0 is PRE and cur_cmd1 is RW0. During the T2 period, because RW1 occupies phase-0, ACT may be delayed to phase-1 of the T2 period 904 and phase-0 of the T3 period 906. Therefore, ACT command crosses the controller clock cycle during the T2 period 904 and the T3 period 906 boundary. As a result, during the T2 period 904, cur_cmd0 is RW1 and cur_cmd1 is ACT0. During the T3 period 906, cur_cmd0 is ACT1 and REF is sent out in phase-1 of the T3 period 906 as cur_cmd1.

Figure 10:
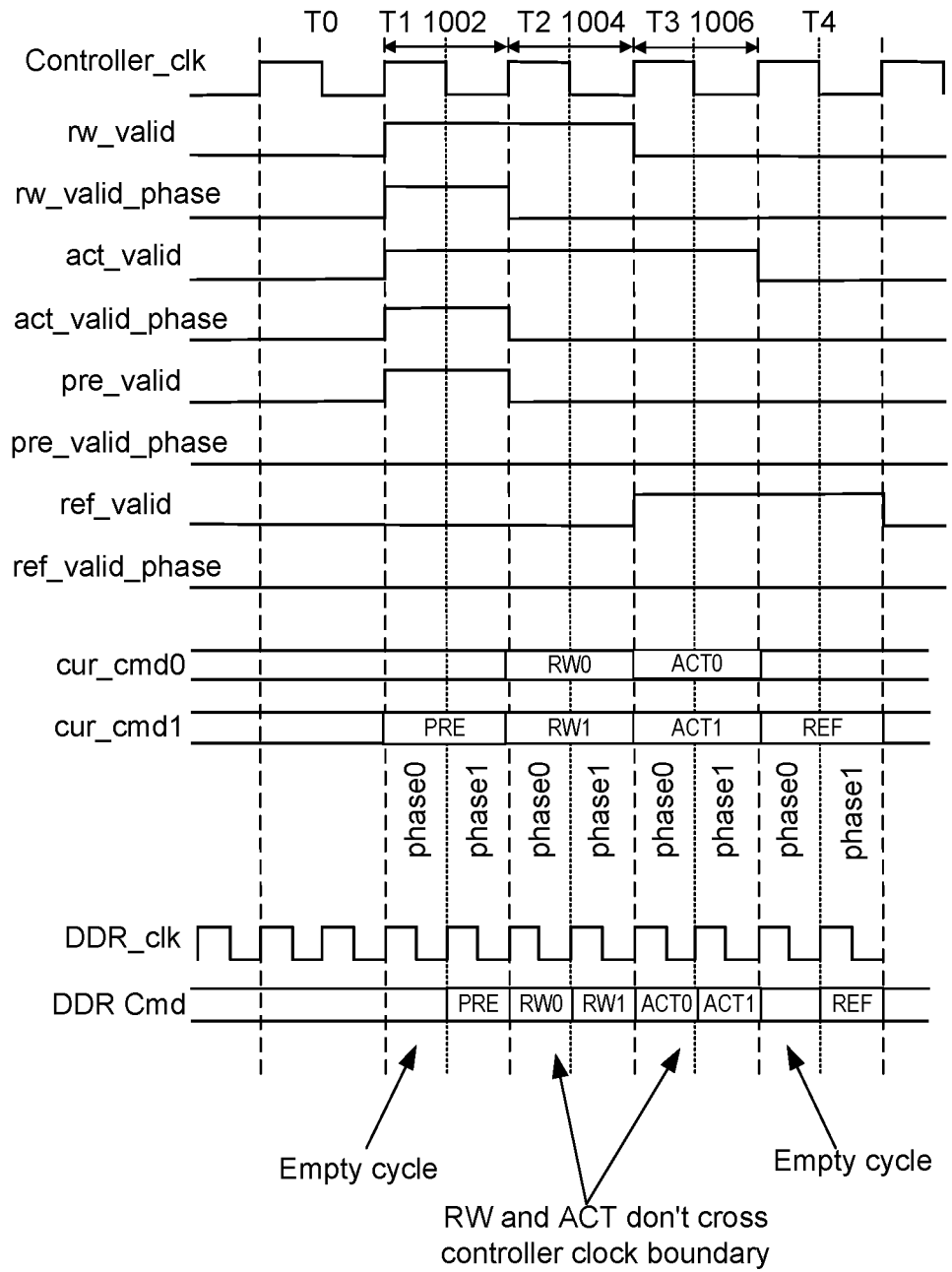
FIG. 10 illustrates a timing diagram using a static multiplexer of the prior art.

FIG. 10 illustrates a timing diagram using a static multiplexer of the prior art. Both RW and ACT commands are two-phase commands. Accordingly, without the benefit of the embodiments described herein, the RW and ACT commands can only be sent during phase 0 of a clock cycle. If RW and ACT are ready in phase 1 of the clock cycle, then RW and ACT commands are delayed till phase 0 of the next clock cycle. Similarly, PRE and REF, which are one-phase commands, can only be sent in phase 1 of the clock cycle. Based on comparing the timing diagrams shown in FIG. 8 and FIG. 9 with the timing diagram of FIG. 10, RW and ACT commands do not cross controller clock boundary may cause one phase of the a cycle being unused. For the prior art static multiplexer command scheduler, RW and ACT commands are always scheduled out in phase-0 because RW and ACT commands don't cross controller clock boundary. During T1 period 1002, because the RW command is not valid in phase0, the RW command cannot be sent out during phase 0 of the T1 period 1002. In addition, rw_valid will be delayed to T2 period 1004. Similar to act_valid. Pre valid is high in T1 period 1002. Though pre_valid_phase=0, PRE can be sent out in phase1 only. As a result, phase 0 of the T1 period 1002 would remain empty and not used for any command. In T2 period 1004, the RW command is valid. RW command is sent out in T2, occupying phase0 and phase1 because the RW commands has a higher priority over the ACT command. ACT command is delayed to T3 period 1006. In T3 period 1006, the ACT command is valid and is sent out, occupying phase0 and phase1. REF is valid in T3 period 1006, but it is pushed out to T4 period because the whole T3 period 1006 is occupied by high priority ACT command. In T4 period, the REF command is sent out in phase1 though it is valid in phase0. Phase 0 of the T3 period therefore remains unused.

Figure 11:
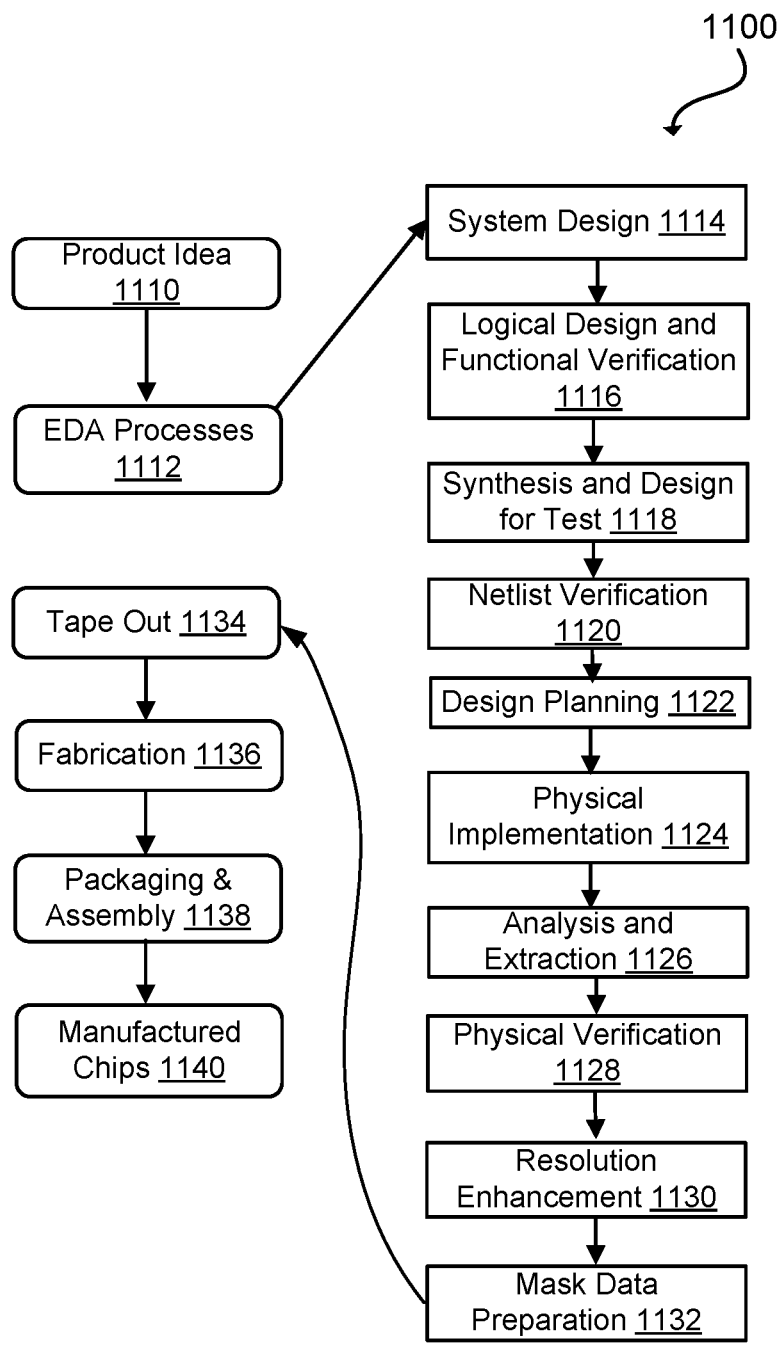
FIG. 11 illustrates a flowchart of various processes used during the design and fabrication of an integrated circuit, according to an exemplary aspect of the present disclosure.

FIG. 11 illustrates an example set of processes 1100 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1110 with information supplied by a designer, information that is transformed to create an article of manufacture that uses a set of EDA processes 1112. When the design is finalized, the design is taped-out 1134, which is when artwork (e.g., geometric patterns) for the integrated circuit is sent to a fabrication facility to manufacture the mask set, which is then used to manufacture the integrated circuit. After tape-out, a semiconductor die is fabricated 1136, and packaging and assembly processes 1138 are performed to produce the finished integrated circuit 1140.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 11. The processes described by being enabled by EDA products (or tools).

During system design 1114, the functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During the logic design and functional verification 1116, modules or components in the circuit are specified in one or more description languages, and the specification is checked for functional accuracy. For example, the components of the circuit may be verified to generate outputs that match the requirements of the specification of the circuit or system being designed. Functional verification may use simulators and other programs such as test bench generators, static HDL checkers, and formal verifiers. In some embodiments, special systems of components referred to as 'emulators' or 'prototyping systems' are used to speed up the functional verification.

During synthesis and design for test 1118, HDL code is transformed into a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1120, the netlist is checked for compliance with timing constraints and for correspondence with the HDL code. During design planning 1122, an overall floor plan for the integrated circuit is constructed and analyzed for timing and top-level routing.

During layout or physical implementation 1124, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1126, the circuit function is verified at the layout level, which permits refinement of the layout design. During physical verification 1128, the layout design is checked to ensure that manufacturing constraints are correct, such as DRC constraints, electrical constraints, lithographic constraints, and that circuitry function matches the HDL design specification. During resolution enhancement 1130, the geometry of the layout is transformed to improve how the circuit design is manufactured.

During tape-out, data is created to be used (after lithographic enhancements are applied if appropriate) for the production of lithography masks. During mask data preparation 1132, the 'tape-out' data is used to produce lithography masks that are used to produce finished integrated circuits.

A storage subsystem of a computer system (such as computer system 1300 of FIG. 13, or host system 1207 of FIG. 12) may be used to store the programs and data structures that are used by some or all of the EDA products described herein, and products used for the development of cells for the library and for the physical and logical design that use the library.

Figure 12:
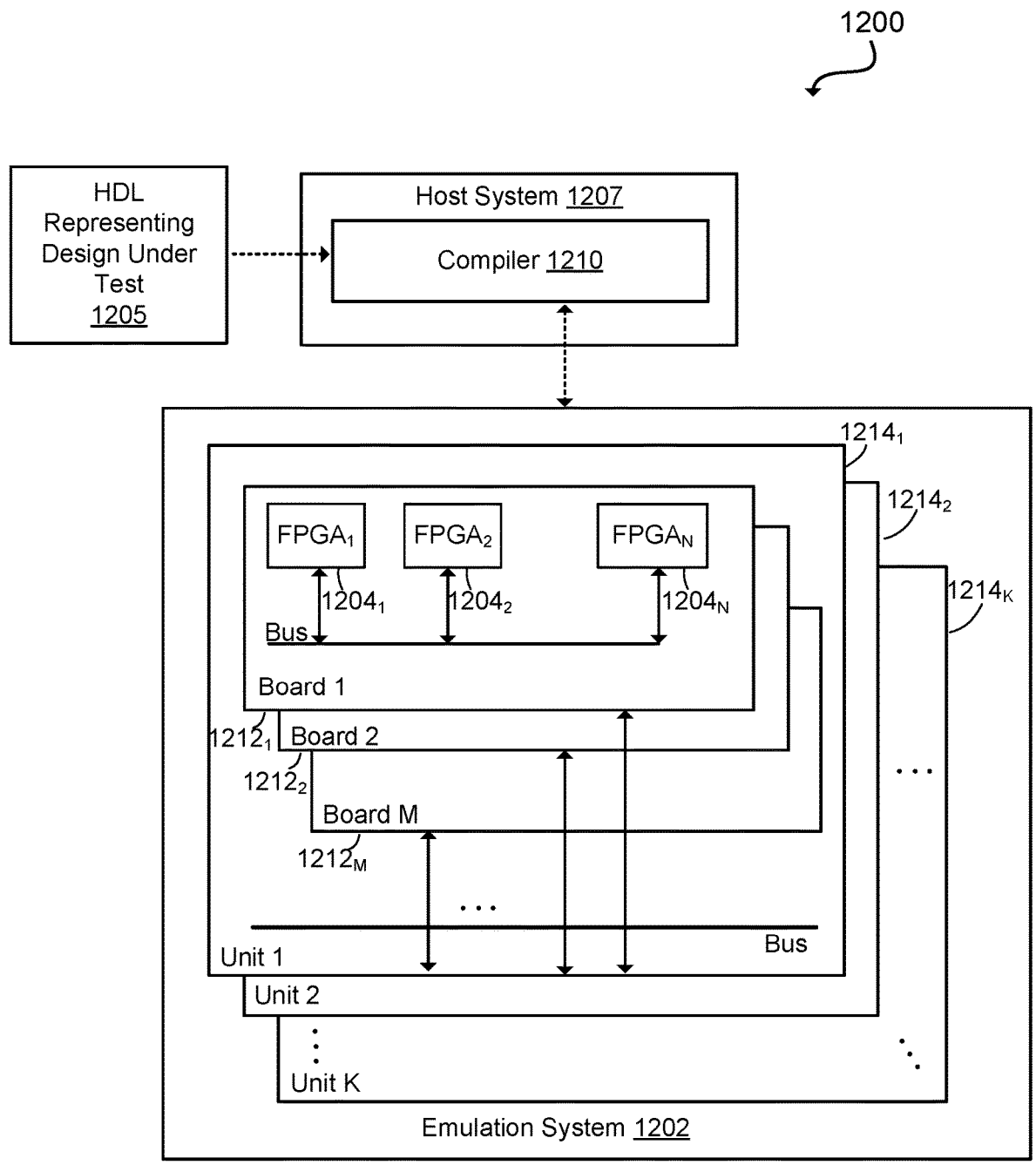
FIG. 12 illustrates an abstract diagram of an example emulation system, according to an exemplary aspect of the present disclosure.

FIG. 12 depicts an abstract diagram of an example emulation environment 1200. An emulation environment 1200 may be configured to verify the functionality of the circuit design. The emulation environment 1200 may include a host system 1207 (e.g., a computer that is part of an EDA system) and an emulation system 1202 (e.g., a set of programmable devices such as Field Programmable Gate Arrays (FPGAs) or processors). The host system generates data and information by using a compiler 1210 to structure the emulation system to emulate a circuit design. Circuit design to be emulated is also referred to as a Design Under Test ('DUT') where data and information from the emulation are used to verify the functionality of the DUT.

The host system 1207 may include one or more processors. In the embodiment where the host system includes multiple processors, the functions described herein as being performed by the host system can be distributed among the multiple processors. The host system 1207 may include a compiler 1210 to transform specifications written in a description language that represents a DUT and to produce data (e.g., binary data) and information that is used to structure the emulation system 1202 to emulate the DUT. The compiler 1210 can transform, change, restructure, add new functions to, and/or control the timing of the DUT.

The host system 1207 and emulation system 1202 exchange data and information using signals carried by an emulation connection. The connection can be but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 1207 and emulation system 1202 can exchange data and information through a third device such as a network server.

The emulation system 1202 includes multiple FPGAs (or other modules) such as FPGAs $1204_1$ and $1204_2$, as well as additional FPGAs to $1204_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 1202 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $1204_1$-$1204_N$ may be placed onto one or more boards $1212_1$ and $1212_2$ as well as additional boards through $1212_M$. Multiple boards can be placed into an emulation unit $1214_1$. The boards within an emulation unit can be connected using the backplane of the emulation unit or any other types of connections. In addition, multiple emulation units (e.g., $1214_1$ and $1214_2$ through $1214_K$) can be connected to each other by cables or any other means to form a multi-emulation unit system.

For a DUT that is to be emulated, the host system 1207 transmits one or more bit files to the emulation system 1202. The bit files may specify a description of the DUT and may further specify partitions of the DUT created by the host system 1207 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 1207 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate-level netlist using the DUT description. A host system can use the netlist of the DUT to partition the DUT into multiple partitions, where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT, which includes interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In the case of multiple re-emulations of an FPGA, merging the results produces a full debug view.

The host system receives, from the emulation system, signals traced by the logic of the identified FPGAs during the re-emulation of the component. The host system stores the signals received from the emulator. The signals traced during the re-emulation can have a higher sampling rate than the sampling rate during the initial emulation. For example, in the initial emulation, a traced signal can include a saved state of the component every X milliseconds. However, in the re-emulation, the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterward, the circuit designer can request to re-emulate the same component for a different time period or to re-emulate another component.

A host system 1207 and/or the compiler 1210 may include subsystems such as, but not limited to, a design synthesizer sub-system, a mapping sub-system, a run time sub-system, a results sub-system, a debug sub-system, a waveform sub-system, and a storage sub-system. The sub-systems can be structured and enabled as an individual or multiple modules, or two or more may be structured as a module. Together these sub-systems structure the emulator and monitor the emulation results.

The design synthesizer sub-system transforms the HDL that is representing a DUT 1205 into gate-level logic. For a DUT that is to be emulated, the design synthesizer sub-system receives a description of the DUT. If the description of the DUT is fully or partially in HDL (e.g., RTL or another level of abstraction), the design synthesizer sub-system synthesizes the HDL of the DUT to create a gate-level netlist with a description of the DUT in terms of gate-level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate-level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), a signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states, and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that is associated with the time period.

The debug sub-system transmits the retrieved interface signals to the emulator. The debug sub-system instructs the debug sub-system to use the identified FPGAs and for the trace and injection logic of each identified FPGA to inject its respective traced signals into the logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to use all the cycles collectively.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 13:
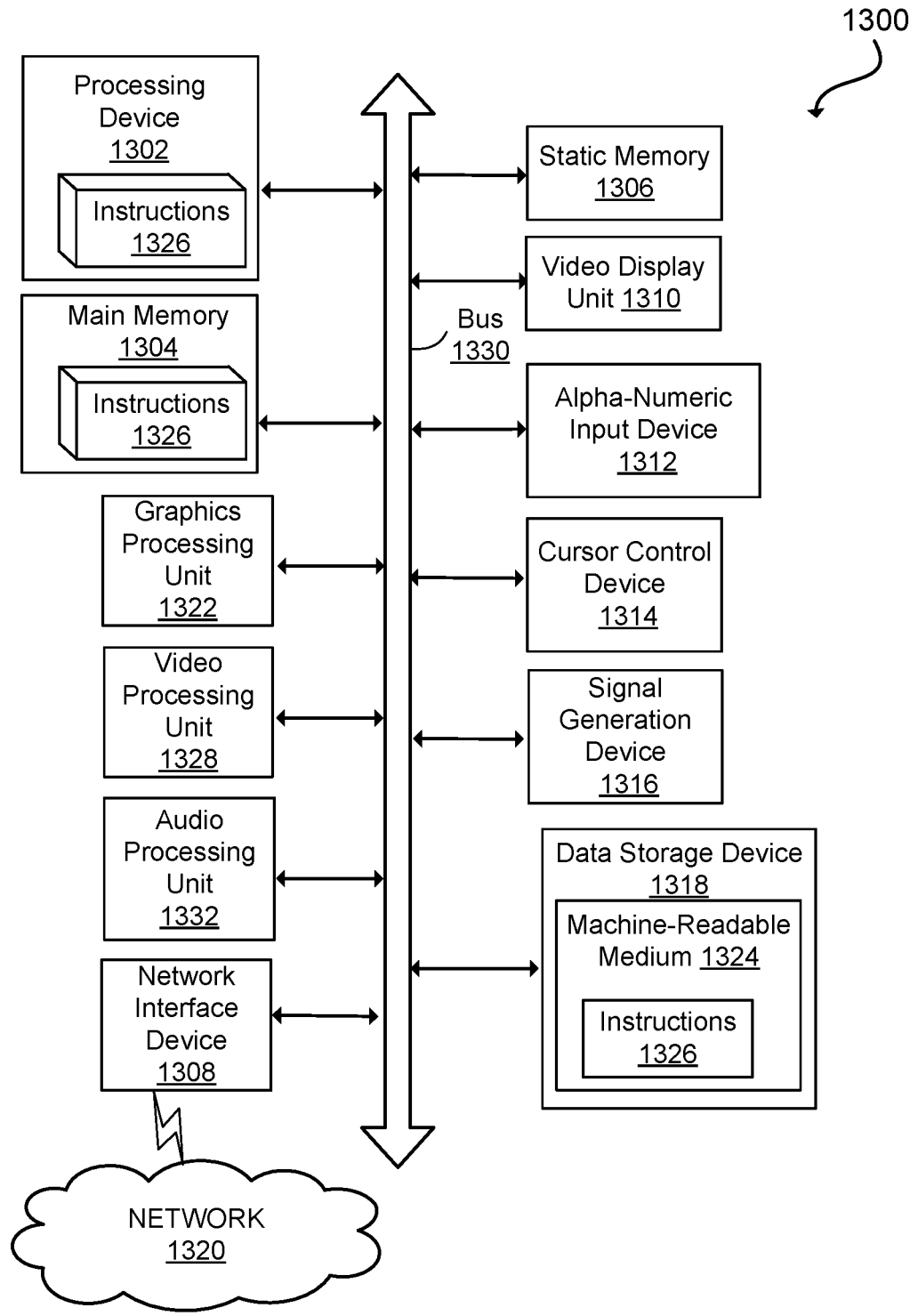
FIG. 13 illustrates an abstract diagram of an example computer system in which aspects of the present disclosure may operate.

FIG. 13 illustrates an example machine of a computer system 1300 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in a client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1300 includes a processing device 1302, a main memory 1304 (e.g., read-only memory (ROM), flash memory, dynamic random access memory (DRAM) such as synchronous DRAM (SDRAM), a static memory 1306 (e.g., flash memory, static random access memory (SRAM), etc.), and a data storage device 1318, which communicate with each other via a bus 1330.

The processing device 1302 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1302 may also be one or more special-purpose processing devices such as an application-specific integrated circuit (ASIC), a field-programmable gate array (FPGA), a digital signal processor (DSP), network processor, or the like. The processing device 1302 may be configured to execute instructions 1326 for performing the operations and steps described herein.

The computer system 1300 may further include a network interface device 1308 to communicate over the network 1320. The computer system 1300 also may include a video display unit 1310 (e.g., a liquid crystal display (LCD) or a cathode ray tube (CRT)), an alphanumeric input device 1312 (e.g., a keyboard), a cursor control device 1314 (e.g., a mouse), a graphics processing unit 1322, a signal generation device 1316 (e.g., a speaker), graphics processing unit 1322, video processing unit 1328, and audio processing unit 1332.

The data storage device 1318 may include a machine-readable storage medium 1324 (also known as a non-transitory computer-readable medium) on which is stored one or more sets of instructions 1326 or software embodying any one or more of the methodologies or functions described herein. The instructions 1326 may also reside, completely or at least partially, within the main memory 1304 and/or within the processing device 1302 during execution thereof by the computer system 1300, the main memory 1304, and the processing device 1302 also constituting machine-readable storage media.

In some implementations, the instructions 1326 include instructions to implement functionality corresponding to the present disclosure. While the machine-readable storage medium 1324 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1302 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work to others skilled in the art most effectively. An algorithm may be a sequence of operations leading to the desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer-readable storage medium, such as but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure, as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as read-only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures, and like elements are labeled with like numerals. The disclosure and drawings are, accordingly, to be regarded in an illustrative sense rather than a restrictive sense.

What is claimed:

1. A method for phase aware dynamic scheduling of a plurality of double data rate (DDR) commands, the method comprising:
   determining a ratio of a first frequency of a DDR controller clock at which the plurality of DDR commands is received to a second frequency of a DDR clock at which one or more DDR devices operates, wherein the second frequency of the DDR clock is higher than the first frequency of the DDR controller clock;
   determining a number of clock cycles of the DDR clock required for each DDR command of the plurality of DDR commands;
   based on the ratio of the first frequency to the second frequency and the number of clock cycles of the DDR clock required for each DDR command, determining a sequence of the plurality of DDR commands according to a priority corresponding to each DDR command of the plurality of DDR commands; and
   transmitting one or more DDR commands of the plurality of DDR commands at the second frequency to the one or more DDR devices over one or more clock cycles of the DDR controller clock according to the determined sequence of the plurality of DDR commands.

2. The method of claim 1, wherein determining the sequence of the plurality of DDR commands comprises determining a validity of the plurality of DDR commands during a phase of a clock cycle of the DDR clock.

3. The method of claim 1, further comprising transmitting a DDR command of the plurality of DDR commands crossing a clock boundary of the DDR controller clock.

4. The method of claim 1, wherein the ratio of the first frequency of the DDR controller clock to the second frequency of the DDR clock is 1:2, the method further comprises transmitting two one-cycle DDR commands or one two-cycle DDR command during a clock cycle of the DDR controller clock.

5. The method of claim 1, wherein the ratio of the first frequency of the DDR controller clock to the second frequency of the DDR clock is 1:4, the method further comprises transmitting two two-cycle DDR commands, four one-cycle DDR commands, or two one-cycle DDR commands and one two-cycle DDR commands during a clock cycle of the DDR controller clock.

6. The method of claim 1, wherein a DDR command of the plurality of DDR commands comprises a read-write (RW) command, an activate (ACT) command, a precharge (PRE) command, a refresh (REF) command, or a deselect (DES) command.

7. The method of claim 1, wherein a DDR command of the plurality of DDR commands is a DDR 4 technology command, low-power DDR 4 technology command, a DDR 5 technology command, or a low-power DDR 5 technology command.

8. A system for phase aware dynamic scheduling of a plurality of double data rate (DDR) commands, comprising:
   a memory configured to store operations; and
   one or more processors configured to perform the operations, the operations comprising:
      determining a ratio of a first frequency of a DDR controller clock at which the plurality of DDR commands is received to a second frequency of a DDR clock at which one or more DDR devices operates, wherein the second frequency of the DDR clock is higher than the first frequency of the DDR controller clock;
      determining a number of clock cycles of the DDR clock required for each DDR command of the plurality of DDR commands;
      based on the ratio of the first frequency to the second frequency and the number of clock cycles of the DDR clock required for each DDR command, determining a sequence of the plurality of DDR commands according to a priority corresponding to each DDR command of the plurality of DDR commands; and transmitting one or more DDR commands of the plurality of DDR commands at the second frequency to the one or more DDR devices over one or more clock cycles of the DDR controller clock according to the determined sequence of the plurality of DDR commands.

9. The system of claim 8, wherein for the determining the sequence of the plurality of DDR commands the operations further comprise determining validity of the plurality of DDR commands during a phase of a clock cycle of the DDR clock.

10. The system of claim 8, wherein the operations further comprise transmitting a DDR command of the plurality of DDR commands crossing a clock boundary of the DDR controller clock.

11. The system of claim 8, wherein the ratio of the first frequency of the DDR controller clock to the second frequency of the DDR clock is 1:2, the operations further comprise transmitting two one-cycle DDR commands or one two-cycle DDR command during a clock cycle of the DDR controller clock.

12. The system of claim 8, wherein the ratio of the first frequency of the DDR controller clock to the second frequency of the DDR clock is 1:4, the operations further comprise transmitting two two-cycle DDR commands, four one-cycle DDR commands, or two one-cycle DDR commands and one two-cycle DDR commands during a clock cycle of the DDR controller clock.

13. The system of claim 8, wherein a DDR command of the plurality of DDR command comprises a read-write (RW) command, an activate (ACT) command, a precharge (PRE) command, a refresh (REF) command, or a deselect (DES) command.

14. The system of claim 8, wherein a DDR command of the plurality of DDR commands is a DDR 4 technology command, low-power DDR 4 technology command, a DDR 5 technology command, or a low-power DDR 5 technology command.

15. A non-transitory, tangible computer-readable device having instructions stored thereon that, when executed by at least one computing device, cause the at least one computing device to perform operations for phase aware dynamic scheduling of a plurality of double data rate (DDR) commands, the operations comprising:

determining a ratio of a first frequency of a DDR controller clock at which the plurality of DDR commands is received to a second frequency of a DDR clock at which one or more DDR devices operates, wherein the second frequency of the DDR clock is higher than the first frequency of the DDR controller clock;

determining a number of clock cycles of the DDR clock required for each DDR command of the plurality of DDR commands;

based on the ratio of the first frequency to the second frequency and the number of clock cycles of the DDR clock required for each DDR command, determining a sequence of the plurality of DDR commands according to a priority corresponding to each DDR command of the plurality of DDR commands; and transmitting one or more DDR commands of the plurality of DDR commands at the second frequency to the one or more DDR devices over one or more clock cycles of the DDR controller clock according to the determined sequence of the plurality of DDR commands.

16. The non-transitory, tangible computer-readable device of claim 15, wherein for the determining the sequence of the plurality of DDR commands the operations further comprise determining validity of the plurality of DDR commands during a phase of a clock cycle of the DDR clock.

17. The non-transitory, tangible computer-readable device of claim 15, wherein the operations further comprise transmitting a DDR command of the plurality of DDR commands crossing a clock boundary of the DDR controller clock.

18. The non-transitory, tangible computer-readable device of claim 15, wherein the ratio of the first frequency of the DDR controller clock to the second frequency of the DDR clock is 1:2, the operations further comprise transmitting two one-cycle DDR commands or one two-cycle DDR command during a clock cycle of the DDR controller clock.

19. The non-transitory, tangible computer-readable device of claim 15, wherein the ratio of the frequency of the DDR controller clock to the frequency of the DDR clock is 1:4, the operations further comprise transmitting two two-cycle DDR commands, four one-cycle DDR commands, or two one-cycle DDR commands and one two-cycle DDR commands during a clock cycle of the DDR controller clock.

20. The non-transitory, tangible computer-readable device of claim 15, wherein a DDR command of the plurality of DDR command comprises a read-write (RW) command, an activate (ACT) command, a precharge (PRE) command, a refresh (REF) command, or a deselect (DES) command, and wherein the DDR command is a DDR 4 technology command, low-power DDR 4 technology command, a DDR 5 technology command, or a low-power DDR 5 technology command.

* * * * *